United States Patent
Tang

[11] Patent Number: 5,838,068
[45] Date of Patent: Nov. 17, 1998

[54] INTEGRATED CIRCUITRY WITH INTERCONNECTION PILLAR

[75] Inventor: Sanh Tang, Boise, Id.

[73] Assignee: Micron Technology, Inc., Boise, Id.

[21] Appl. No.: 903,198

[22] Filed: Jul. 15, 1997

Related U.S. Application Data

[63] Continuation of Ser. No. 672,305, Jun. 27, 1996, abandoned, which is a continuation of Ser. No. 447,218, May 22, 1995, abandoned, which is a division of Ser. No. 298,209, Aug. 29, 1994, Pat. No. 5,506,172.

[51] Int. Cl.⁶ .......................... H01L 23/48; H01L 23/52; H01L 29/40; H01L 23/62
[52] U.S. Cl. .......................... 257/750; 257/377; 257/382; 257/385; 257/756; 257/903
[58] Field of Search .................. 257/750, 756, 257/903, 377, 382, 385

[56] References Cited

U.S. PATENT DOCUMENTS

| | | | |
|---|---|---|---|
| 4,176,003 | 11/1979 | Brower et al. | 430/313 |
| 4,178,674 | 12/1979 | Liu et al. | 257/377 |
| 4,240,196 | 12/1980 | Jacobs et al. | 257/377 |
| 4,394,406 | 7/1983 | Gardiner et al. | 437/195 |
| 4,516,147 | 5/1985 | Komatsu et al. | 257/756 |
| 4,897,704 | 1/1990 | Sakurai | 257/756 |
| 4,975,381 | 12/1990 | Taka et al. | 257/756 |
| 5,126,231 | 6/1992 | Levy | 430/313 |
| 5,162,259 | 11/1992 | Kolar et al. | 437/192 |
| 5,219,793 | 6/1993 | Cooper et al. | 437/195 |
| 5,243,220 | 9/1993 | Shibata et al. | 257/748 |
| 5,292,676 | 3/1994 | Manning | 437/193 |
| 5,326,713 | 7/1994 | Lee | 437/191 |
| 5,358,903 | 10/1994 | Kim | 437/195 |

FOREIGN PATENT DOCUMENTS

| | | | |
|---|---|---|---|
| 57-109367 | 7/1982 | Japan | 257/377 |
| 5-234933 (A) | 12/1993 | Japan . | |

*Primary Examiner*—Teresa M. Arroyo
*Attorney, Agent, or Firm*—Wells, St. John, Roberts, Gregory & Matkin, P.S.

[57] ABSTRACT

A semiconductor processing method includes: a) providing a substrate having a base region to which electrical connection is to be made; b) providing a first layer of a conductive first material; c) providing an etch stop layer over the first layer; d) etching a contact opening through the etch stop and first layers to the base region; e) providing a second layer of first material outwardly of the etch stop layer and within the contact opening to a thickness greater than the first layer thickness and extending outwardly beyond the contact opening upper edge; f) removing first material of the second layer and defining a second layer plug within the contact, the second layer plug having an outermost surface extending outwardly beyond the contact opening upper edge and thereby providing the second layer plug to be of greater thickness than the first layer; g) masking outwardly of the first layer and the second layer plug to define a mask pattern for definition of a circuit component from the first layer which connects with the base region through the second layer plug; and h) etching unmasked portions of the first layer and second layer plug to define a circuit component which connects with the base region through the second layer plug, the greater thickness of the second layer plug as compared to the thickness of the first layer restricting etching into the base region during etching. Integrated circuitry is also disclosed.

12 Claims, 7 Drawing Sheets

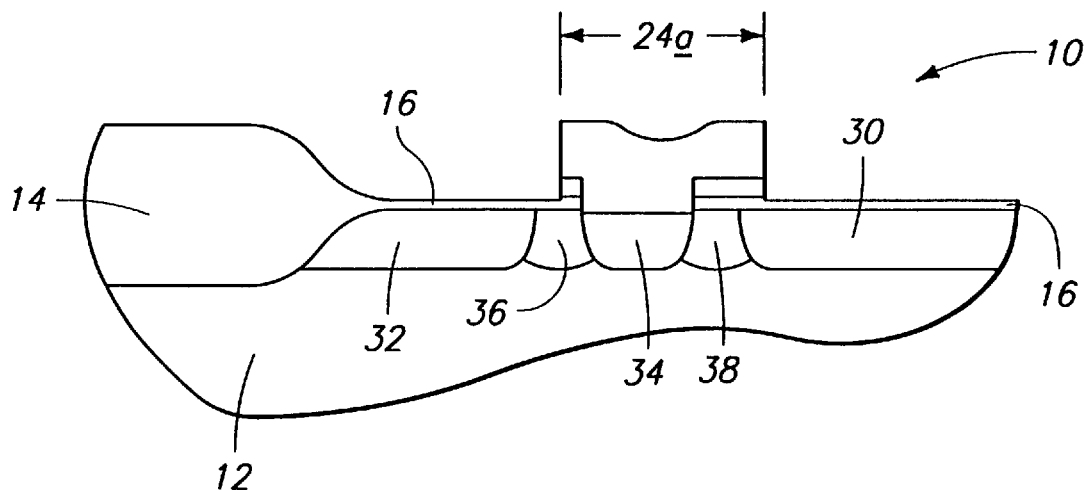
_Fig 5_
_PRIOR ART_
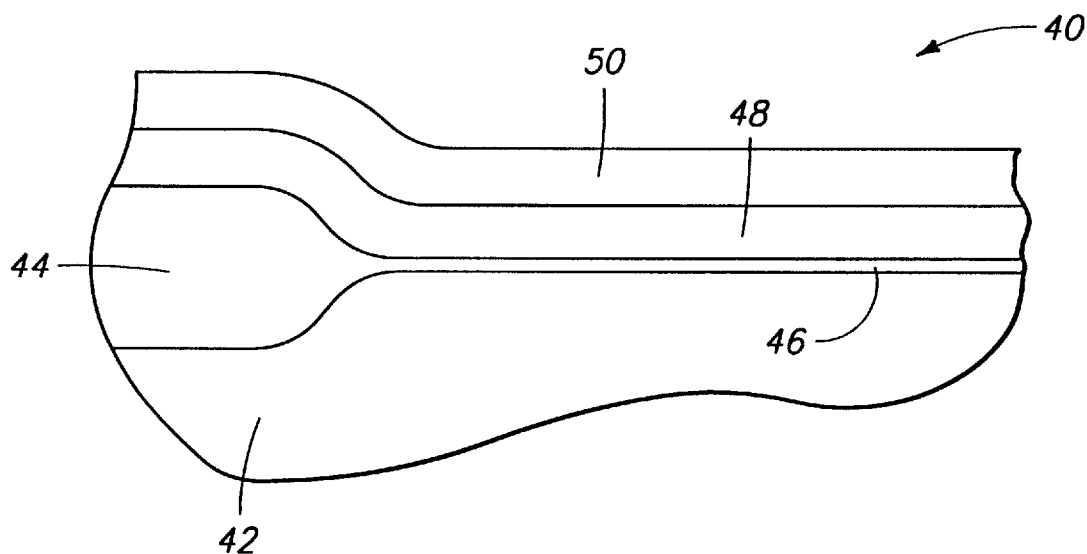
_Fig 6_

INTEGRATED CIRCUITRY WITH INTERCONNECTION PILLAR

RELATED PATENT DATA

This patent resulted from a file wrapper continuation application of U.S. patent application Ser. No. 08/672,305, filed on Jun. 27, 1996, entitled "Integrated Circuitry with Interconnection Pillar" listing the inventor as Sanh Tang, now abandoned, which is a file wrapper continuation application of a divisional application of U.S. patent application Ser. No. 08/447,218, filed on May 22, 1995, entitled "A Semiconductor Processing Method Of Forming An Electrical Interconnection Between An Outer Layer And An Inner Layer, and Integrated Circuitry" listing the inventor as Sanh Tang, now abandoned, which was a divisional application of U.S. patent application Ser. No. 08/298,209, filed on Aug. 29, 1994, entitled "A Semiconductor Processing Method Of Forming An Electrical Interconnection Between An Outer Layer And An Inner Layer, and Integrated Circuitry" listing the inventor as Sanh Tang, and which is now U.S. Pat. No. 5,506,172.

TECHNICAL FIELD

This invention relates generally to semiconductor processing methods of forming electrical interconnections between an outer layer and an inner layer, and to integrated circuitry.

BACKGROUND OF THE INVENTION

In semiconductor processing, one challenge is to assure precise alignment of all the various photomasks. Mask misalignment can result in wafer destruction at worst or render certain integrated circuitry useless at best. To accommodate for mask misalignment, safeguards are built into the processing.

One place in semiconductor processing where photomasks are utilized is in defining buried or other contacts in making electrical interconnection between an inner or lower region on a substrate to an outer or higher region. One example technique and the problems associated therewith are described with reference to FIGS. 1–5. FIG. 1 illustrates a semiconductor wafer fragment indicated generally by reference numeral 10. Such is comprised of a bulk substrate region 12, field oxide 14, and a gate oxide layer 16. An initially continuous thin layer 18 of polysilicon is deposited atop field oxide 14 and gate oxide 16. Thereafter, a buried contact opening 20 is provided through layers 18 and 16 to outwardly expose substrate 12 to which electrical interconnection is to be made.

Unfortunately, the outwardly exposed portion of substrate 12 is typically oxidized to provide an undesired insulating thin layer of oxide (not shown) atop the exposed substrate. This must be removed, and is typically accomplished by a blanket HF dip. The HF dip is typically conducted after all masking material has been removed and immediately prior to deposition of any subsequent layer. Were it not for protecting polysilicon layer 18, thin gate oxide layer 16 outside of buried contact 20 would also undesirably be etched during the dip. This would be undesirable as the degradation or removal of gate oxide is not practically controllable or predictable, thus requiring protective polysilicon layer 18.

A subsequent second and thicker layer 22 of an electrically conductive material, such as conductively doped polysilicon, is deposited to make electrical connection through buried contact 20 with substrate 12. This layer is then subjected to a masking step for purposes of patterning the combined polysilicon layers 22 and 18 into conductive lines or other circuit components which integrally connect with substrate 12 at contact opening 20.

FIGS. 2 and 3 illustrate an undesired misalignment of one of the masks for producing buried contact opening 20 or the line and component produced from layers 22 and 18. Range 20 represents the buried contact mask opening, while range 24 illustrates the mask utilized for producing a line or component 26. As is apparent, the etch utilized to produce component or line 26 is misaligned relative to buried contact 20 such that an over-etch 28 into bulk substrate 12 occurs, potentially destroying or rendering the wafer useless.

To accommodate or allow for such inevitable misalignment, the target area where buried contact 20 and mask area 24 occur is enlarged, such as shown in FIGS. 4 and 5. A larger mask area range 24a is provided for producing what is commonly referred to as a buried contact enlarged cap 28. This provides for a degree of relative inevitable misalignment for assuring 100% overlap of buried contact 20 relative to desired circuit component 26 such that over-etching into the substrate is prevented.

However, this undesirably creates additional problems of its own. More wafer real estate is consumed, thus decreasing desired circuit density. Further, such typically results in an additional implant step to assure desired circuit interconnection within substrate 12. FIG. 5 illustrates desired previously provided diffusion regions 30 and 32 within bulk substrate 12. A desired implant 34 was provided through contact opening 20 prior to deposition of polysilicon layer 22. Continuous electrical interconnection among regions 32, 34 and 30 is desired. To accommodate for this, a separate buried contact implanting step to provide interconnecting implants 36 and 38 must be conducted. This adds complexity and additional steps wherein the fragile wafers might be destroyed.

It would be desirable to overcome these and perhaps other problems associated with the prior art in developing a semiconductor processing method of forming an electrical interconnection between an outer layer and an inner layer.

BRIEF DESCRIPTION OF THE DRAWINGS

Preferred embodiments of the invention are described below with reference to the following accompanying drawings.

FIG. 5 is a diagrammatic section view of the prior art FIG. 4 wafer fragment.

FIG. 6 is a diagrammatic section view of a semiconductor wafer fragment at one processing step in accordance with the invention.

DETAILED DESCRIPTION OF THE PREFERRED EMBODIMENTS

Figure 1:
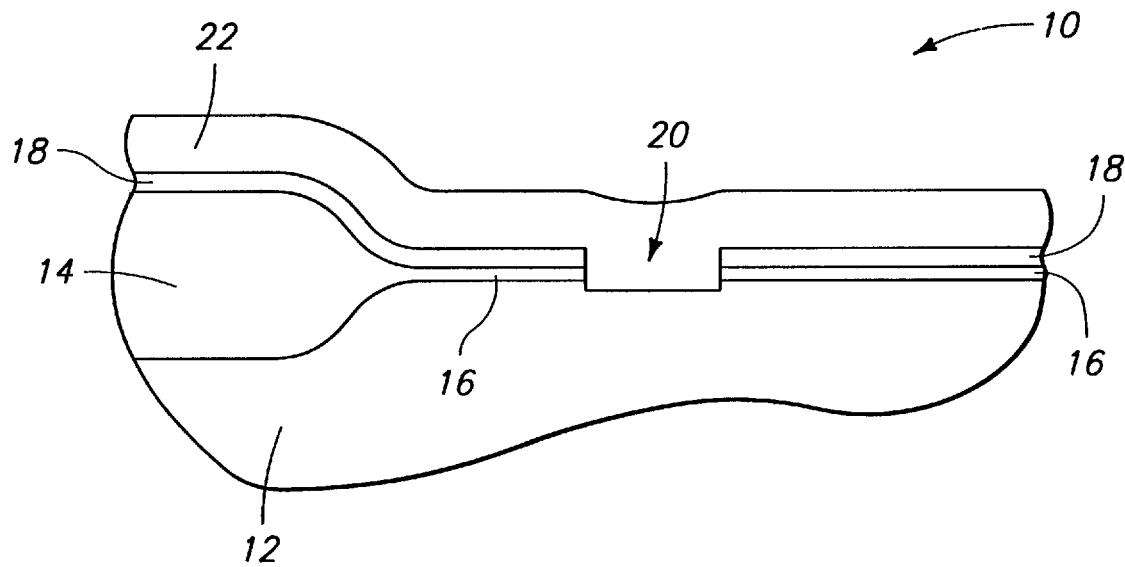
FIG. 1 is a diagrammatic sectional view of a prior art wafer fragment, and is discussed in the "Background" section above.
Figure 2:
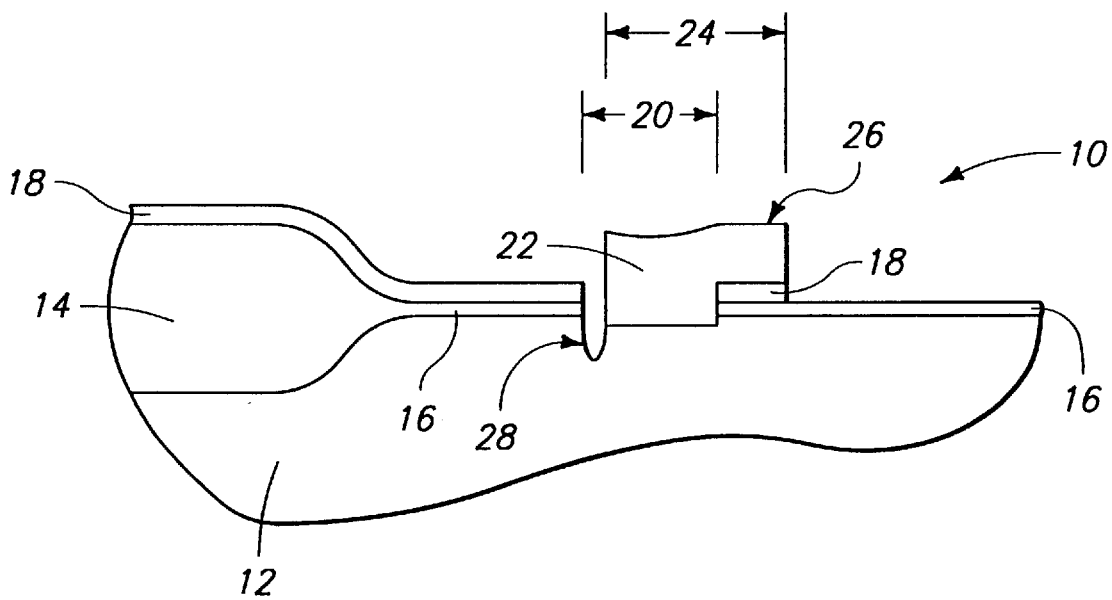
FIG. 2 is a view of the prior art FIG. 1 wafer fragment at a processing step subsequent to that shown by FIG. 1.
Figure 3:
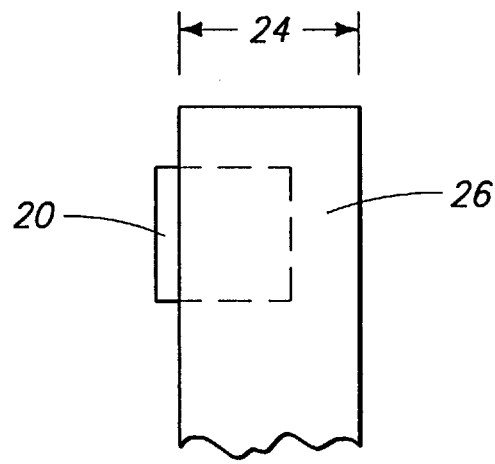
FIG. 3 is a top view of the FIG. 2 wafer fragment.
Figure 4:
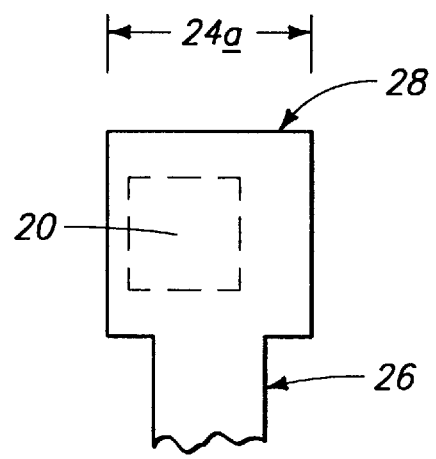
FIG. 4 is a top view of an alternate prior art embodiment wafer fragment.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming an electrical interconnection between a base region and an outer layer comprises the following steps:

providing a substrate having a base region to which electrical connection is to be made;

providing a first layer of an electrically conductive first material over the substrate to a first thickness;

providing an etch stop layer over the first layer, the etch stop layer comprising a material to which the first material is selectively etchable;

etching a contact opening through the etch stop layer and first layer to the base region, the contact opening defining a contact opening upper edge of the first layer;

providing a second layer of the first material outwardly of the etch stop layer and within the contact opening to a second thickness, the second thickness being greater than the first thickness and the second layer extending outwardly beyond the first layer contact opening upper edge;

removing first material of the second layer and defining a second layer plug within the contact opening, the second layer plug having an outermost surface extending outwardly beyond the first layer contact opening upper edge and thereby providing the second layer plug to be of greater thickness than the first layer;

masking outwardly of the first layer and the second layer plug to define a mask pattern for definition of an electrically conductive circuit component from the first layer which connects with the base region through the second layer plug; and etching unmasked portions of the first layer and second layer plug to define an electrically conductive circuit component which connects with the base region through the second. layer plug, the greater thickness of the second layer plug as compared to the thickness of the first layer restricting etching into the base region during etching.

In accordance with another aspect of the invention, an integrated circuit comprises:

a base region to which electrical interconnection is made;

an electrically conductive interconnection pillar extending from and outwardly of the base region, the pillar having an outermost surface; and an electrically conductive line extending from the pillar, the line having a joining outermost surface where it joins with the pillar, the pillar outermost surface being outwardly beyond the line joining outermost surface.

More particularly with reference to FIGS. 6–13, a semiconductor wafer fragment in accordance with the invention is indicated generally with reference numeral 40. Such is comprised of a bulk substrate 42 having field oxide 44 and associated gate oxide 46. Bulk substrate 42 typically and preferably comprises monocrystalline silicon. A first layer 48 of an electrically conductive first material is provided over field oxide 44 and gate oxide 46, and thus over the substrate, to a first thickness. An example preferred thickness is from 1,000 Angstroms to 4,000 Angstroms, with approximately 2,000 Angstroms being more preferred. An example and preferred material for layer 48 is conductively doped polysilicon. Other example electrically conductive materials would include suicides, such as $WSi_x$ and $TiSi_x$. An etch stop layer 50 is provided over first layer 48. Etch stop layer 50 comprises a material to which the first material is selectively etchable. An example and preferred material is silicon dioxide deposited by decomposition of tetraethylorthosilicate (TEOS). Alternate examples include phosphosilicate glass (PSG), spin-on-glass (SOG) and $Si_3N_4$. Preferably, the material of etch stop layer 50 is also selectively etchable relative to the first material. The preferred embodiment silicon dioxide and conductively doped polysilicon are examples of two such materials which can be independently selectively etched relative to one another by techniques well known to people of skill in the art. An example and preferred thickness for layer 50 is from 3,000 Angstroms to 4,000 Angstroms.

Figure 7:
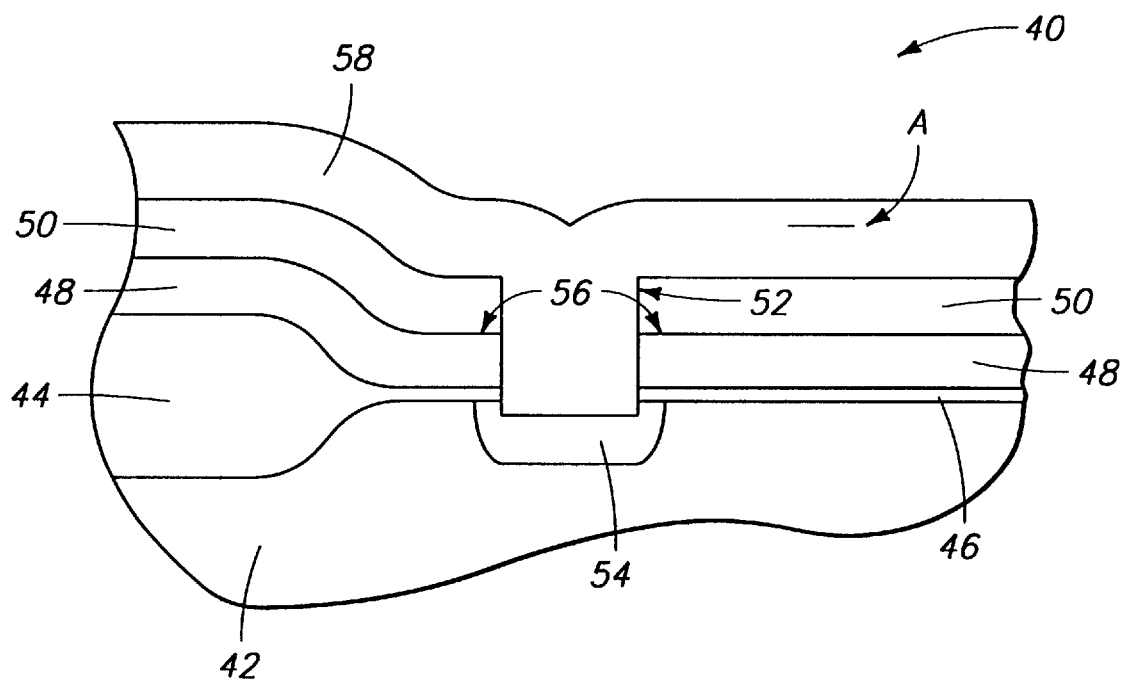
FIG. 7 is a view of the FIG. 6 wafer fragment at a processing step subsequent to that shown by FIG. 6.

Referring to FIG. 7, wafer fragment 40 is photomasked and etched to produce a contact opening 52 through etch stop layer 50 and first layer 48, and downwardly through gate oxide layer 46 to outwardly expose substrate 42. Doping with a conductivity enhancing impurity is then conducted through contact opening 52 to produce conductively doped region 54. Such comprises a base region to which electrical interconnection is to be made. For purposes of the continuing discussion, contact opening 52 defines a contact opening upper edge 56 of first layer 48.

A second layer 58 of the first material is deposited outwardly of etch stop layer 50 and within contact opening 52 to a second thickness. The second thickness is greater than the first thickness to provide second layer 58 extending outwardly to some local lowest elevation location "A" which is outwardly beyond first layer contact opening upper edge 56. An example preferred thickness of layer 58 is at least 30% greater than the radius of contact opening 52.

Figure 8:
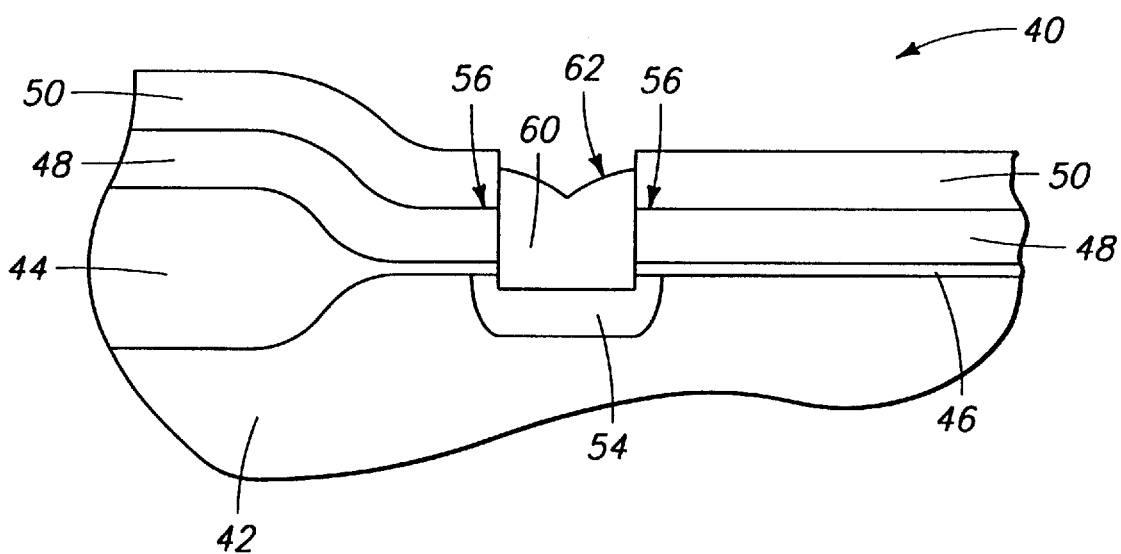
FIG. 8 is a view of the FIG. 6 wafer fragment at a processing step subsequent to that shown by FIG. 7.

Referring to FIG. 8, first material of second layer 58 is removed and a second layer plug 60 of the first material is defined within contact opening 52. An example and preferred technique is a timed dry etch utilizing reactive chlorine gas. The removal is conducted to define an outermost plug surface 62 which extends or is positioned outwardly beyond first layer contact opening upper edge 56. This thereby provides the second layer plug 60 to be of greater thickness than first layer 48. Alternately, plug 60 can be considered as an electrically conductive interconnection pillar extending from and outwardly of base region 54, and having an outermost surface 62. Preferably, the etch is conducted to remove all second layer 58 material from atop etch stop layer 50, such that plug 60 at this point in the process is entirely received within contact opening 52.

Figure 9:
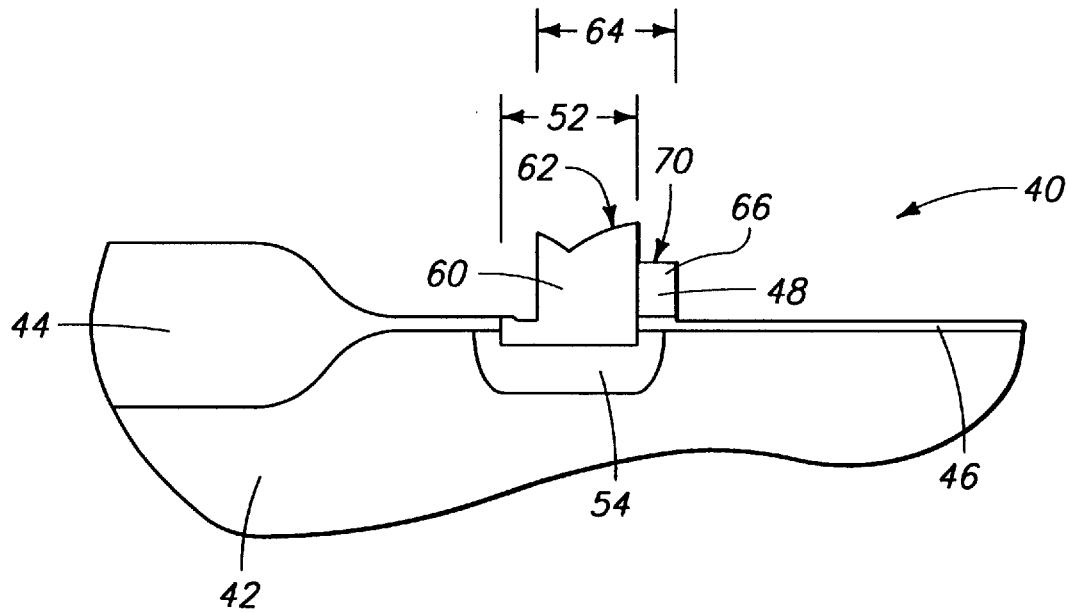
FIG. 9 is a view of the FIG. 6 wafer fragment at a processing step subsequent to that shown by FIG. 8.
Figure 10:
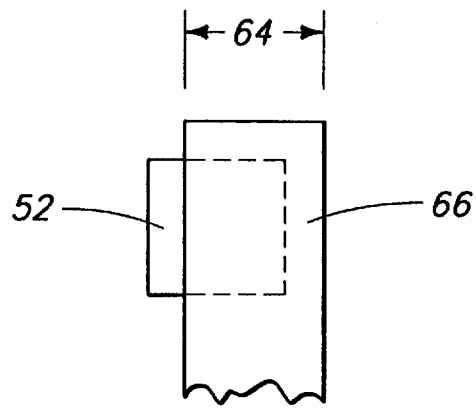
FIG. 10 is a top view of FIG. 9.

Referring to FIGS. 9 and 10, masking is conducted outwardly of first layer 48 and second layer plug 60 to define a mask pattern 64 which will be utilized for definition of an electrically conductive circuit component, such as a conductive line 66, from first layer 48 which connects with base region 54 through second layer plug 60. Mask range 64 is purposely shown misaligned relative to buried contact 52 to illustrate the facility of the invention in accommodating for such misalignment. Prior to such masking, all of etch stop layer 50 would preferably be stripped from the substrate selectively relative to the first material of plug 60 and layer 48.

Unmasked portions of the etch stop layer (if any remains), first layer 48 and second layer plug 60 (due to misalignment) are then etched. This defines an electrically conductive circuit component, such as conductive line 66, which connects with base region 54 through second layer plug 60. Note that the greater thickness of second layer plug 60 as compared to the thickness of first layer 48 effectively restricts etching into the substrate or base region during such etching. This facilitates any inherent misalignment or effectively self-aligns the buried contact mask relative to component mask 64, thus enabling elimination of a buried contact cap (FIG. 10). Conductive line 66 extends outwardly from pillar 60, and has a joining outermost surface 70 where it joins with pillar 60. Pillar outermost surface 62 is positioned outwardly beyond joining outermost surface 70.

Figure 11:
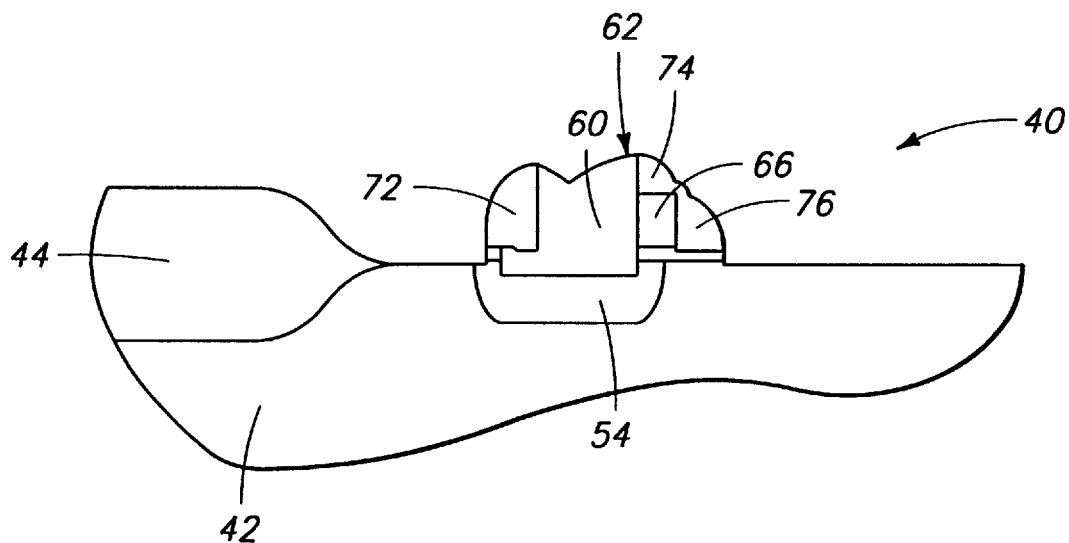
FIG. 11 is a view of the FIG. 6 wafer fragment at a processing step subsequent to that shown by FIG. 9.
Figure 12:
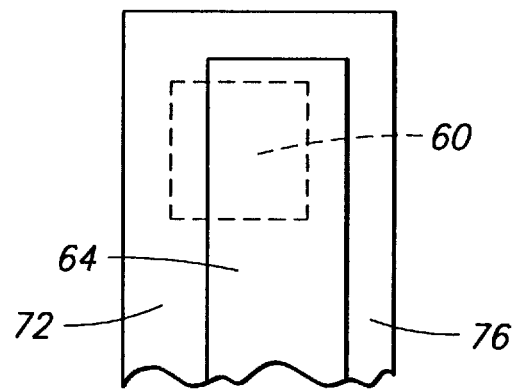
FIG. 12 is a top view of FIG. 11.

Referring to FIGS. 11 and 12, a suitable layer of oxide is provided and subjected to anisotropic spacer etch to produce the illustrated spacers 72, 74, and 76. Alternately, plug 60 and line 66 might be capped with a higher conductive silicide material, such as $WSi_x$.

Figure 13:
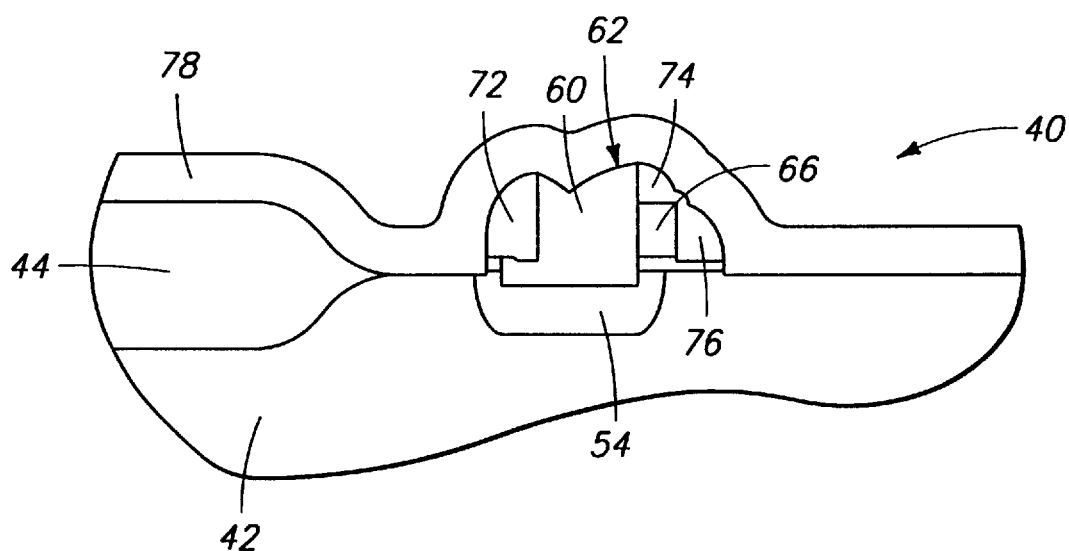
FIG. 13 is a view of the FIG. 6 wafer fragment at a processing step subsequent to that shown by FIG. 11.

Referring to FIG. 13, an insulating layer 78 (such as $SiO_2$) is provided to cap outermost surface 62 of pillar/plug 60.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. An integrated circuit comprising:
    a semiconductor substrate;
    a base region within the semiconductor substrate to which electrical interconnection is made;
    a first insulative layer over the base region;
    an electrically conductive pillar extending through the first insulative layer and into the base region; the pillar having a portion extending elevationally above the first insulative layer and an elevationally uppermost surface at a top of the portion extending elevationally above the first insulative layer; the portion extending elevationally above the first insulative layer comprising, in cross-section, a pair of laterally opposing sidewalls; the pair of laterally opposing sidewalls being a first sidewall and a second sidewall;
    an electrically conductive line extending from the first sidewall; the line having a joining elevationally uppermost surface where it joins with the first sidewall; the pillar elevationally uppermost surface being elevationally above the line joining uppermost surface; the pillar elevationally uppermost surface not extending laterally to over the electrically conductive line; the pillar constituting a uniform composition of material at least from a location elevationally below the line through a location elevationally above the line joining uppermost surface;
    a first insulative spacer along an entirety of the second sidewall; and
    a second insulative spacer along the first sidewall and over the conductive line joining elevationally uppermost surface.

2. The integrated circuit of claim 1 wherein the pillar and conductive line comprise the same electrically conductive material.

3. The integrated circuit of claim 1 wherein the pillar uppermost surface is capped with a second insulative layer.

4. The integrated circuit of claim 1 wherein the pillar uppermost surface has a first area and the pillar interconnects with the base region over a second area, the first area being smaller than the second area.

5. An integrated circuit comprising:
    a base region to which electrical interconnection is made, the base region being within a substrate;
    a first insulative layer over the base region;
    an electrically conductive pillar extending through the first insulative layer and to the base region; the pillar having a portion extending elevationally above the first insulative layer and an elevationally uppermost surface at a top of the portion extending elevationally above the first insulative layer; the pillar uppermost surface having a first area and the pillar interconnecting with the base region over a second area, the first area being smaller than the second area; and
    an electrically conductive line contacting the pillar adjacent the first area thereof and extending outward of the pillar; the line having a joining elevationally uppermost surface where it joins with the pillar; the pillar elevationally uppermost surface being elevationally above the line joining uppermost surface; the pillar elevationally uppermost surface not extending laterally to over the electrically conductive line.

6. The integrated circuit of claim 5 wherein the electrically conductive line only contacts the pillar at the first area thereof.

7. An integrated circuit comprising:
    a base region to which electrical interconnection is made, the base region being within a substrate;
    an insulative layer over the base region;
    an electrically conductive pillar extending through the insulative layer and to the base region; the pillar having a portion extending elevationally above the insulative layer and an elevationally uppermost surface at a top of the portion extending elevationally above the insulative layer; the portion extending elevationally above the insulative layer comprising, in cross-section, a pair of laterally opposing sidewalls; the pair of laterally opposing sidewalls being a first sidewall and a second sidewall; the pillar uppermost surface having a first area and the pillar interconnecting with the base region over a second area, the first area being smaller than the second area; and
    an electrically conductive line extending from the first sidewall adjacent the first area of the pillar; the line having a joining elevationally uppermost surface where it joins with the first sidewall; the pillar elevationally uppermost surface being elevationally above the line joining uppermost surface; the pillar elevationally uppermost surface not extending laterally to over the electrically conductive line; the pillar constituting a uniform composition of material at least from a location elevationally below the line through a location elevationally above the line joining uppermost surface.

8. The integrated circuit of claim 7 wherein the electrically conductive line only contacts the pillar at the first area thereof.

9. An integrated circuit comprising:
    a base region to which electrical interconnection is made;

an insulative layer over the base region;

an electrically conductive pillar extending through the insulative layer and to the base region, the pillar having an elevationally uppermost surface at a top of the pillar and comprising an "L" cross-sectional shape; and an electrically conductive line extending from the pillar.

10. The integrated circuit of claim 9 wherein the line has a joining elevationally uppermost surface where it joins with the pillar; the pillar elevationally uppermost surface being elevationally above the line joining uppermost surface; and the pillar elevationally uppermost surface not extending laterally to over the electrically conductive line.

11. The integrated circuit of claim 9 wherein the "L" cross-sectional shape comprises a horizontally extending base portion and a stem extending upwardly from the horizontally extending base portion, the horizontally extending base portion comprising a section extending horizontally outwardly from the stem, the section extending horizontally outwardly from the stem having a different width near the stem than distant from the stem.

12. The integrated circuit of claim 9 wherein the "L" cross-sectional shape comprises a horizontally extending base portion and a stem extending upwardly from the horizontally extending base portion, the horizontally extending base portion comprising a section extending horizontally outwardly from the stem, the section extending horizontally outwardly from the stem being thinner near the stem than distant from the stem.

* * * * *

UNITED STATES PATENT AND TRADEMARK OFFICE
CERTIFICATE OF CORRECTION

PATENT NO. : 5,838,068
DATED : November 17, 1998
INVENTOR(S) : Sanh Tang

It is certified that error appears in the above-identified patent and that said Letters Patent is hereby corrected as shown below:

Col. 3, l. 51: Remove "." after "second"

Col. 4, l. 12: Replace "suicides," with --silicides,--.

Signed and Sealed this

Second Day of March, 1999

Attest:

Attesting Officer

Q. TODD DICKINSON

Acting Commissioner of Patents and Trademarks